(12) United States Patent
Lin et al.

(10) Patent No.: US 11,316,083 B2
(45) Date of Patent: Apr. 26, 2022

(54) BACKLIGHT MODULE AND DISPLAY DEVICE

(71) Applicant: HUIZHOU CHINA STAR OPTOELECTRONICS TECHNOLOGY CO., LTD., Guangdong (CN)

(72) Inventors: Yuexia Lin, Guangdong (CN); Yongyuan Qiu, Guangdong (CN)

(73) Assignee: HUIZHOU CHINA STAR OPTOELECTRONICS TECHNOLOGY CO., LTD., Huizhou (CN)

( * ) Notice: Subject to any disclaimer, the term of this patent is extended or adjusted under 35 U.S.C. 154(b) by 321 days.

(21) Appl. No.: 16/615,137

(22) PCT Filed: Nov. 5, 2019

(86) PCT No.: PCT/CN2019/115482
§ 371 (c)(1),
(2) Date: Nov. 20, 2019

(87) PCT Pub. No.: WO2021/017240
PCT Pub. Date: Feb. 4, 2021

(65) Prior Publication Data
US 2021/0408346 A1    Dec. 30, 2021

(30) Foreign Application Priority Data

Jul. 26, 2019   (CN) .......................... 201910679945.3

(51) Int. Cl.
*H01L 33/58*   (2010.01)
*H01L 33/54*   (2010.01)
*F21V 8/00*    (2006.01)

(52) U.S. Cl.
CPC ............ *H01L 33/58* (2013.01); *G02B 6/0068* (2013.01); *G02B 6/0073* (2013.01); *H01L 33/54* (2013.01)

(58) Field of Classification Search
CPC ....... H01L 33/58; H01L 33/54; G02B 6/0068; G02B 6/0073
See application file for complete search history.

(56) References Cited

U.S. PATENT DOCUMENTS

| | | | | |
|---|---|---|---|---|
| 8,421,957 B2* | 4/2013 | Sekiguchi | ......... | G02F 1/133603 349/62 |
| 2012/0274203 A1* | 11/2012 | Yokotani | ............... | H01L 33/508 313/512 |
| 2016/0003424 A1 | 1/2016 | Wu | | |

FOREIGN PATENT DOCUMENTS

| CN | 101639181 A | 2/2010 |
|---|---|---|
| CN | 102110750 A | 6/2011 |
| CN | 102130236 A | 7/2011 |
| CN | 102655199 A | 9/2012 |
| CN | 105444045 A | 3/2016 |

* cited by examiner

*Primary Examiner* — Mary Ellen Bowman
(74) *Attorney, Agent, or Firm* — JMB Davis Ben-David

(57) ABSTRACT

An embodiment of the present invention discloses a backlight module and a display device. The backlight module includes a circuit board. A side surface of the circuit board is provided with a plurality of light emitting elements spaced apart from each other. A light output surface of at least one of the light emitting elements is covered with a first encapsulation layer. A side surface of the first encapsulation layer away from the at least one light emitting elements is a curved surface.

18 Claims, 3 Drawing Sheets

US 11,316,083 B2

BACKLIGHT MODULE AND DISPLAY DEVICE

FIELD OF INVENTION

The present invention relates to the field of display technologies, and in particular, to a backlight module and a display device.

BACKGROUND OF INVENTION

At the present stage, the development of display technologies is changing with each passing day, and an emergence of various screen technologies provides unlimited possibilities for electronic terminals, especially rapid applications of display technologies represented by organic light emitting diodes (OLEDs).

At present, since mini light emitting diodes (mini-LEDs) can achieve ultra-thin and multi-partition, and are products using small-size chips, the mini-LEDs can be compared with OLED products in realistic effect. Furthermore, in terms of material cost, the mini-LEDs can be more competitive than OLEDs and are favored by backlight display industries.

When the mini-LEDs on the market are used as a backlight, the flip chip is usually die-bonded on the circuit board. At this time, the mini-LEDs are in a chip state. In order to protect the chip from external force and external environment damage during subsequent production, transportation, and use, it is usually necessary to cover the circuit board with a layer of encapsulant for protection. However, in a lamp board structure of the mini-LED, wide-angle light is easily returned to the circuit board due to a total internal reflection in the adhesive layer at the air interface. A reflectivity of a white lacquer of the circuit board is only 85%, which is far less than a reflection sheet (reflectivity of 95% or more), so an energy loss of the wide-angle light is serious.

That is, in the prior art, light easily encounters a total reflection at a light output surface of an encapsulation layer, causing a light energy loss and reducing a light output ratio.

Technical Problem

That is, in the prior art, light is easily to occur a totally reflection at a light output surface of an encapsulation layer, causing a light energy loss and lowing a light output ratio.

Technical Solution

An embodiment of the present invention provides a backlight module and a display device, which can destroy a total reflection of light at a light output surface of an encapsulation layer, avoid a light energy loss and improve a light output ratio.

In order to achieve the above problem, in a first aspect, the present invention provides a backlight module. The backlight module comprises a circuit board, wherein a side surface of the circuit board is provided with a plurality of light emitting elements spaced apart from each other, a light output surface of at least one of the light emitting elements is covered with a first encapsulation layer, and a side surface of the first encapsulation layer away from the at least one of the light emitting elements is a curved surface;

wherein an outer contour of a first cross section of the first encapsulation layer is on a first ellipse, the first cross section is perpendicular to a surface of the circuit board, a thickness of the first encapsulation layer is half of a length of a long axis of the first ellipse, and the long axis of the first ellipse is perpendicular to the surface of the circuit board; and a refractive index of the first encapsulation layer is less than 1.2.

Wherein, the backlight module further comprises a second encapsulation layer, wherein the second encapsulation layer covers the side surface of the first encapsulation layer away from the light emitting elements, and a surface of the second encapsulation layer away from the side surface of the first encapsulation layer is a curved surface.

In order to achieve the above problem, in a second aspect, the present invention provides a backlight module. The backlight module comprises a circuit board, wherein a side surface of the circuit board is provided with a plurality of light emitting elements spaced apart from each other, a light output surface of at least one of the light emitting elements is covered with a first encapsulation layer, and a side surface of the first encapsulation layer away from the at least one of the light emitting elements is a curved surface.

Wherein, an outer contour of a first cross section of the first encapsulation layer is on a first ellipse, the first cross section is perpendicular to a surface of the circuit board, a thickness of the first encapsulation layer is half of a length of a long axis of the first ellipse, and the long axis of the first ellipse is perpendicular to the surface of the circuit board.

Wherein, a refractive index of the first encapsulation layer is less than 1.2

Wherein, the backlight module further comprises a second encapsulation layer, wherein the second encapsulation layer covers the side surface of the first encapsulation layer away from the light emitting elements, and a surface of the second encapsulation layer away from the side surface of the first encapsulation layer is a curved surface.

Wherein, an outer contour of a second cross section of the second encapsulation layer comprises a first curve and a second curve, the second cross section is perpendicular to the surface of the circuit board, the first curve is disposed on a second ellipse, the second curve is disposed on a third ellipse, the second ellipse and the third ellipse do not coincide, a long axis of the second ellipse is perpendicular to the surface of the circuit board, and a long axis of the third ellipse is perpendicular to the surface of the circuit board.

Wherein, the second ellipse and the third ellipse are symmetric about a long axis of the first ellipse, and a thickness of the outer contour of the second cross section is less than half a width of the outer contour of the second cross section.

Wherein, an intersection of the first curve and the second curve is disposed on a side of an apex of the outer contour of the first cross section away from the circuit board, and a distance from an intersection of the first curve and the second curve to the apex of the outer contour of the first cross section is less than a half of a length of the long axis of the first ellipse.

Wherein, a refractive index of the second encapsulation layer is greater than 1.5.

Wherein, a material of the first encapsulation layer is any one of silica gel or photoresist, a material of the second encapsulation layer is any one of a silica gel or a photoresist, and the light emitting element is an LED chip.

In order to achieve the above problem, in a third aspect, the present invention provides a display device. The display device comprises a backlight module, wherein the backlight module comprises a circuit board, a side surface of the circuit board is provided with a plurality of light emitting elements spaced apart from each other, a light output surface of at least one of the light emitting elements is covered with a first encapsulation layer, and a side surface of the first encapsulation layer away from the at least one of the light emitting elements is a curved surface.

Wherein, an outer contour of a first cross section of the first encapsulation layer is on a first ellipse, the first cross section is perpendicular to a surface of the circuit board, a thickness of the first encapsulation layer is half of a length of a long axis of the first ellipse, and the long axis of the first ellipse is perpendicular to the surface of the circuit board.

Wherein, a refractive index of the first encapsulation layer is less than 1.2

Wherein, the backlight module further comprises a second encapsulation layer, the second encapsulation layer covers the side surface of the first encapsulation layer away from the light emitting elements, and a surface of the second encapsulation layer away from the side surface of the first encapsulation layer is a curved surface.

Wherein, an outer contour of a second cross section of the second encapsulation layer comprises a first curve and a second curve, the second cross section is perpendicular to the surface of the circuit board, the first curve is disposed on a second ellipse, the second curve is disposed on a third ellipse, the second ellipse and the third ellipse do not coincide, a long axis of the second ellipse is perpendicular to the surface of the circuit board, and a long axis of the third ellipse is perpendicular to the surface of the circuit board.

Wherein, the second ellipse and the third ellipse are symmetric about a long axis of the first ellipse, and a thickness of the outer contour of the second cross section is less than half a width of the outer contour of the second cross section.

Wherein, an intersection of the first curve and the second curve is disposed on a side of an apex of the outer contour of the first cross section away from the circuit board, and a distance from an intersection of the first curve and the second curve to the apex of the outer contour of the first cross section is less than a half of a length of the long axis of the first ellipse.

Wherein, a refractive index of the second encapsulation layer is greater than 1.5.

Wherein, a material of the first encapsulation layer is any one of silica gel or photoresist, a material of the second encapsulation layer is any one of a silica gel or a photoresist, and the light emitting element is a LED chip Beneficial Effect Beneficial effects: an embodiment of the present invention provides a backlight module. The backlight module comprises a circuit board, wherein a side surface of the circuit board is provided with a plurality of light emitting elements spaced apart from each other. A light output surface of at least one of the light emitting elements is covered with a first encapsulation layer, and a side surface of the first encapsulation layer away from the at least one of the light emitting elements is a curved surface. In the present invention, the side surface of the first encapsulation layer away from the at least one of the light emitting elements is a curved surface, and a total reflection of light at the light output surface can be destroyed relative to the planar encapsulation layer, thereby improving a light output ratio and preventing a light energy loss.

DESCRIPTION OF DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

DETAILED DESCRIPTION OF PREFERRED EMBODIMENTS

Figure 1:
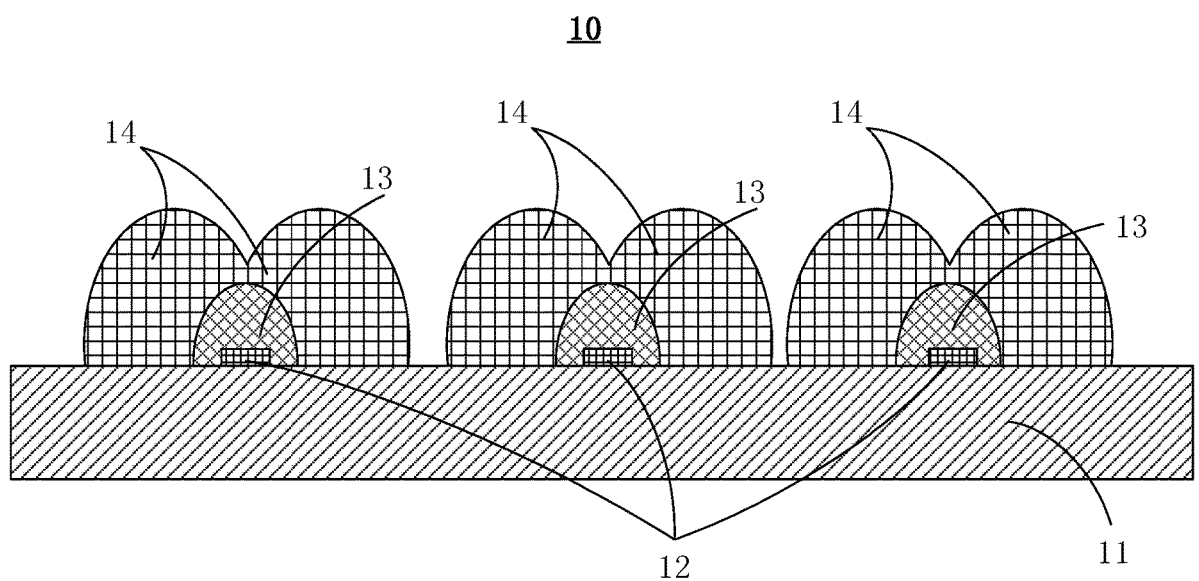
FIG. 1 is a schematic structural view of a backlight module according to an embodiment of the present invention.

The technical solutions in the embodiments of the present invention are clearly and completely described in the following with reference to the accompanying drawings in the embodiments of the present invention. Obviously, the described embodiments are only a part of the embodiments of the present invention, and not all of the embodiments. Based on the embodiments in the present invention, all other embodiments obtained by those skilled in the art without creative efforts are within the scope of the present invention.

In the description of the present invention, it is to be understood that the term "center", "longitudinal", "lateral", "length", "width", "thickness", "upper", "lower", "front", "rear", "left", "right", "vertical", "horizontal", "top", "bottom", "inner", "outer", "clockwise", "counterclockwise", "axial", "radial", "circumferential orientation or positional relationship", or the like indicating a positional relationship of the orientation shown in the accompanying drawings is for convenience of description only, and the present invention is to simplify the description, not to indicate or imply that the referred devices or elements must have a specific orientation, the orientation of a particular configuration and operation, and cannot be construed as limiting the present invention.

In addition, the terms "first" and "second" are only used for descriptive purposes, and should not be understood to indicate or imply relative importance or the number of technical features specified implicitly. Thus, features defined as "first" or "second" may explicitly or implicitly include at least one of the described features. In the description of the present invention, the meaning of "plurality" is at least two, e.g. two, three, etc., unless otherwise specifically limited.

The term "illustrative" used in this application means "being used as example, illustration, or explanation." Any embodiment described as "illustrative" in the application is not necessarily to be construed as preferred or advantageous over other embodiments. To enable any person skilled in the art to implement and use the present application, the following description is given. In the following description, details are listed for the purpose of explanation. It will be appreciated that one of ordinary skill in the art will recognize that the present application can be implemented without these specific details. In other embodiments, well-known structures and procedures are not described in detail to avoid unnecessary detail. Therefore, the present application is not intended to be limited to the embodiments shown, but is in accordance with the broadest scope of the principles and features disclosed herein.

An embodiment of the present invention provides a backlight module. The backlight module comprises a circuit board, wherein a side surface of the circuit board is provided with a plurality of light emitting elements spaced apart from each other. A light output surface of at least one of the light emitting elements is covered with a first encapsulation layer, and a side surface of the first encapsulation layer away from the at least one of the light emitting elements is a curved surface. The backlight module of the embodiment of the present invention can be applied to various display devices. Detailed descriptions are as follows.

Referring to FIG. 1. FIG. 1 is a schematic structural view of a backlight module according to an embodiment of the present invention.

As shown in FIG. 1, in the embodiment of the present invention, a backlight module 10 comprises a circuit board 11, wherein a side surface of the circuit board 11 is provided with a plurality of light emitting elements 12 spaced apart from each other. A light output surface of at least one of the light emitting elements 12 is covered with a first encapsulation layer 13, and a side surface of the first encapsulation layer 13 away from the at least one of the light emitting elements 12 is a curved surface. Preferably, the light output surface of each of the light emitting elements 12 is covered with the first encapsulation layer 13. The curved surface of the first encapsulation layer 13 may be a spherical surface, an ellipsoidal surface, a cross sectional curved surface, or a curved surface consisting of a plurality of curved surfaces, etc., which is not limited in this invention. Since the side surface of the first encapsulation layer 13 away from the at least one light emitting element 12 is a curved surface, when the light emitting element 12 emits light through the surface of the first encapsulation layer 13, a total reflection does not occur. Compared with a planar encapsulation layer in the prior art, a total reflection structure of the prior art planar encapsulation layer is destroyed, thereby improving a light output ratio of the light emitting element 12.

In the embodiment of the present invention, the circuit board 11 is a flexible printed circuit (FPC). The FPC is a highly reliable and excellent flexible printed circuit board made of polyimide or polyester film, and has characteristics of high wiring density, light weight, thin thickness, and good bendability. The circuit board 11 controls the light emitting element 12 to provide backlight for a display panel. In other embodiments, the circuit board 11 can be other types of circuit boards 11, which is not limited in the invention.

In the embodiment of the present invention, the light emitting element 12 is an LED chip. Preferably, the LED chip is a mini-LED. A plurality of light emitting elements 12 are arranged in a matrix on the circuit board 11 to achieve uniform light output. The LED chip can be an LED chip of various colors such as a red LED chip, a blue LED chip, and a green LED chip, which is not limited in this application.

In the embodiment of the present invention, a refractive index of the first encapsulation layer 13 is less than 1.2. A material of the first encapsulation layer 13 is any one of silica gel or photoresist. Furthermore, the first encapsulation layer 13 is a silica gel layer containing phosphor or a silica gel layer containing quantum dots.

In the embodiment of the present invention, the backlight module 10 further comprises a second encapsulation layer 14 covering the side surface of the first encapsulation layer 13 away from the light emitting element 12. A surface of the second encapsulation layer 14 away from the first encapsulation layer 13 is a curved surface. The curved surface of the second encapsulation layer 14 may be a spherical surface, an ellipsoidal surface, a cross sectional curved surface, or a curved surface consisting of a plurality of curved surfaces, etc., which is not limited in this application. A material of the second encapsulation layer 14 is any one of silica gel or photoresist. Furthermore, the second encapsulation layer 14 is a silica gel layer containing phosphor or a silica gel layer containing quantum dots.

In the embodiment of the present invention, the first encapsulation layer 13 is covered on the light emitting elements 12 distributed in an array by heat molding and temperature-lowering curing. The second encapsulation layer 14 is covered on the first encapsulation layer 13 by heat molding and temperature-lowering curing. In other embodiments, the first encapsulation layer 13 and the second encapsulation layer 14 may be formed in other manners, which is not limited in this application.

In the embodiment of the present invention, the refractive index of the second encapsulation layer 14 is greater than 1.5. The refractive index of the second encapsulation layer 14 is greater than the refractive index of air, and the second encapsulation layer 14 can diffuse the light. When the light mixing height is constant, a diffusion range of the light of a single light emitting element 12 is greater than that of the prior art, so that the number of the light emitting elements 12 per unit area of the circuit board 11 can be reduced, and the manufacturing cost of the backlight module 10 can be reduced.

Figure 2:
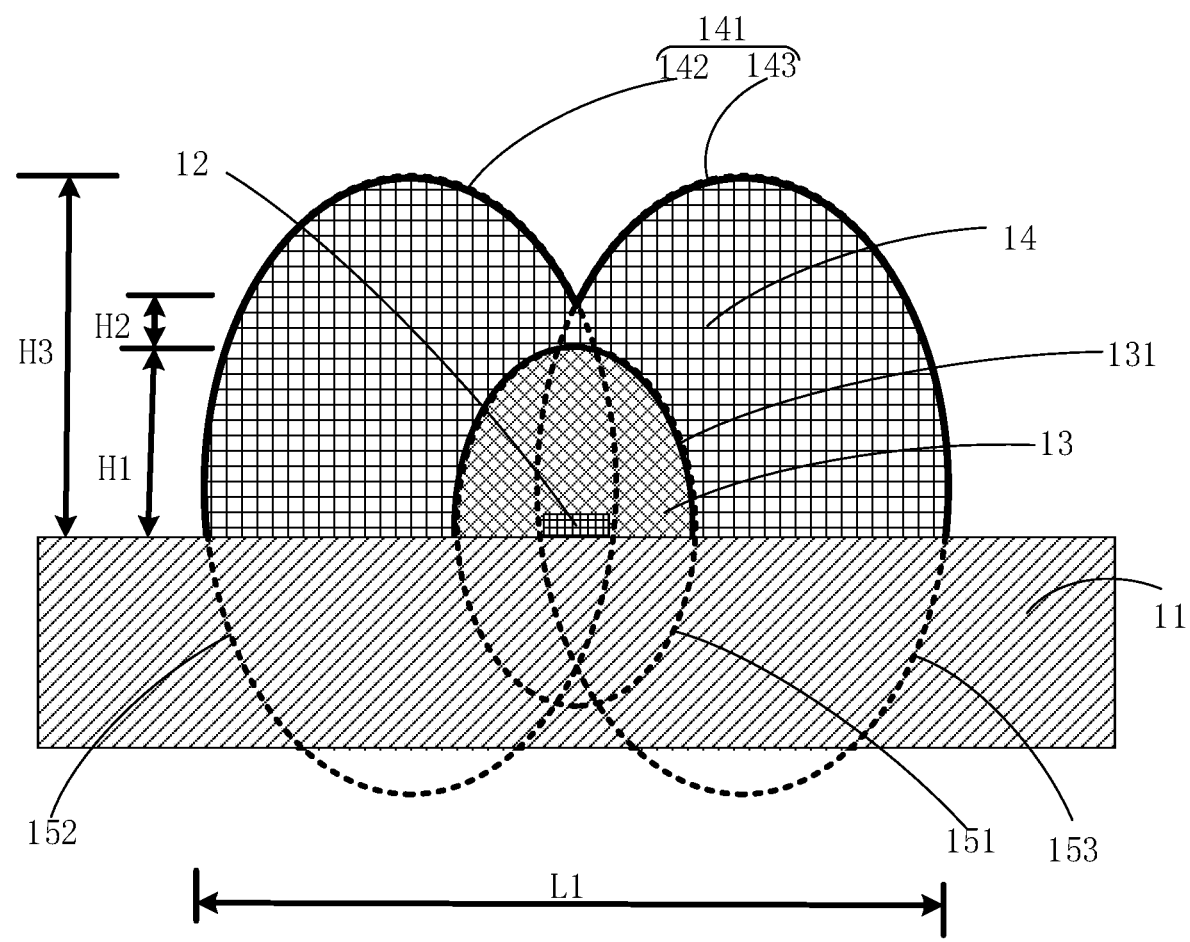
FIG. 2 is a schematic structural view of a first embodiment of a first encapsulation layer and a second encapsulation layer in the backlight module of FIG. 1.

To further illustrate the specific structure of the first encapsulation layer and the second encapsulation layer of the present invention, please refer to FIG. 2, which is a schematic structural view of the first embodiment of the first encapsulation layer and the second encapsulation layer in the backlight module of FIG. 1.

With reference to FIG. 1 and FIG. 2, in the embodiment of the present invention, an outer contour 131 of a first cross section of the first encapsulation layer 13 is on a first ellipse 151, and the first cross section is perpendicular to a surface of the circuit board 11. A thickness H1 of the first encapsulation layer 13 is half a length of a long axis of the first ellipse 151, and the long axis of the first ellipse 151 is perpendicular to the surface of the circuit board 11. It is apparent that the thickness H1 of the first encapsulation layer 13 is half the length of the long axis of the first ellipse 151, and the long axis of the first ellipse 151 is perpendicular to the surface of the circuit board 11. Then, the light emitting element 12 is disposed at a center of the first ellipse 151, and the light emitting element 12 emits light from the center of the ellipse, and the light output surface has an elliptical contour, which can further improve the light output ratio.

In the embodiment of the present invention, an outer contour 141 of a second cross section of the second encapsulation layer 14 comprises a first curve 142 and a second curve 143, and the second cross section is perpendicular to the surface of the circuit board 11. The first curve 142 is disposed on a second ellipse 152, the second curve 143 is disposed on a third ellipse 153, and the second ellipse 152 and the third ellipse 153 do not coincide. A long axis of the second ellipse 152 is perpendicular to the surface of the circuit board 11, and a long axis of the third ellipse 153 is perpendicular to the surface of the circuit board 11. That is, a surface contour of the second encapsulation layer 14 is a curve consisting of two elliptical arcs, and the surface of the second encapsulation layer 14 in contact with the air has an elliptical contour, which can further improve the diffusion effect of the light and further increase the light output ratio.

Furthermore, the second ellipse 152 and the third ellipse 153 are symmetric about the long axis of the first ellipse 151. A thickness H3 of the outer contour 141 of the second cross section is less than half a width L1 of the outer contour 141 of the second cross section. A relative position of the light emitting element 12 and the first curve 142 is the same as a relative position of the light emitting element 12 and the second curve 143. The light emitted from the first curve 142 and the second curve 143 of the light emitting element 12 is completely the same, so that the light emitting element 12 emits light uniformly. Moreover, by limiting the thickness of the outer contour 141 of the second cross section, an astigmatism effect of the second encapsulation layer 14 can be ensured, and the thickness of the second encapsulation layer 14 can be reduced, and the manufacturing cost can be reduced.

Furthermore, an intersection of the first curve 142 and the second curve 143 is disposed on a side of an apex of the outer contour 131 of the first cross section away from the circuit board 11. A distance H2 from the intersection of the first curve 142 and the second curve 143 to the apex of the outer contour 131 of the first cross section is less than a half a length of the long axis of the first ellipse 151. Wherein, a half the length of the long axis of the first ellipse 151 is the thickness H1 of the first encapsulation layer 13. That is, H2 is smaller than H1.

Figure 3:
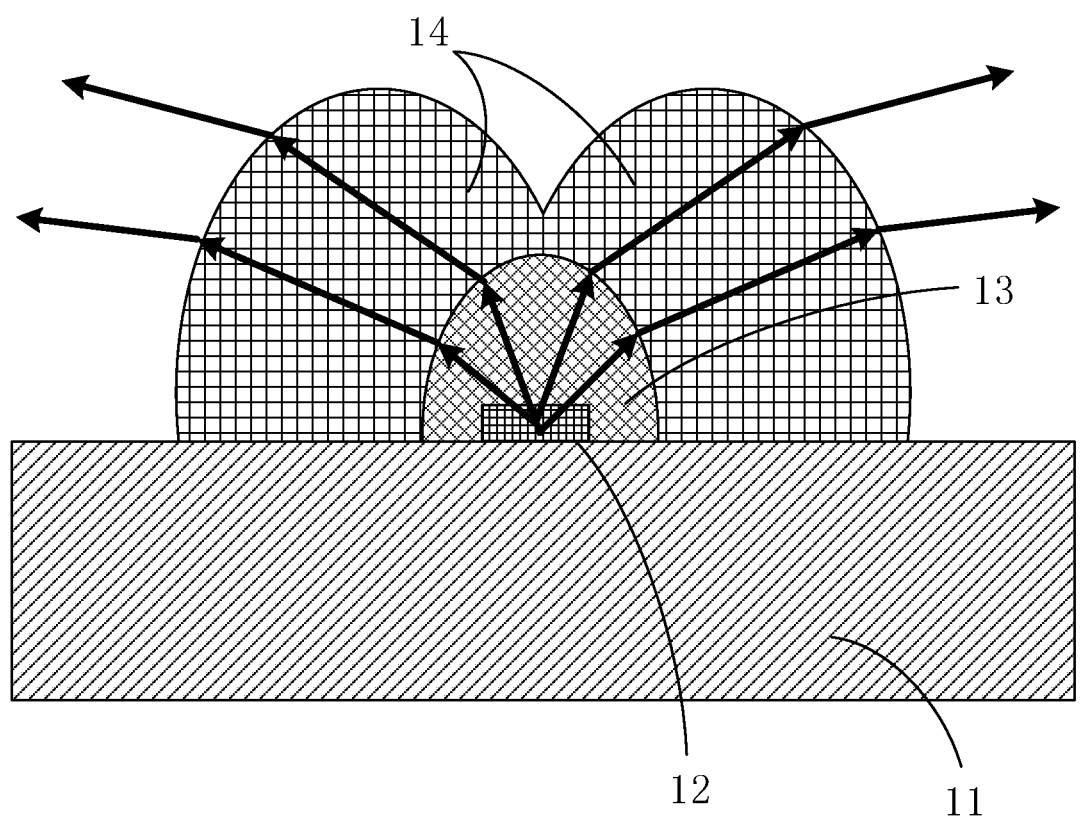
FIG. 3 is a schematic view showing light emitted from a light emitting element of the backlight module in FIG. 1.

FIG. 3 is a schematic view showing the light emitted from a light emitting element of the backlight module of FIG. 1.

As shown in FIG. 3, light is emitted from the light emitting element 12, and a first refraction is performed at an interface between the first encapsulation layer 13 and the second encapsulation layer 14. Since the interface between the first encapsulation layer 13 and the second encapsulation layer 14 is a curved surface, the total reflection of the light is prevented, and the light can be more incident into the second encapsulation layer 14 from the interface between the first encapsulation layer 13 and the second encapsulation layer 14. The light passes through a second refraction at the interface between the second encapsulation layer 14 and the air. Since the interface between the second encapsulation layer 14 and the air is a curved surface, and the refractive index of the second encapsulation layer 14 is much larger than that of the air, the diffusion range of the light can be significantly increased. In the case where the light mixing height is constant, the distance between the adjacent two light emitting elements 12 can be greater, so that the number of the light emitting elements 12 on the circuit board 11 can be reduced, thereby reducing the manufacturing cost of the backlight module 10.

The embodiment of the present invention provides a backlight module. The backlight module comprises a circuit board, wherein a side surface of the circuit board is provided with a plurality of light emitting elements 12 spaced apart from each other. A light output surface of at least one of the light emitting elements 12 is covered with a first encapsulation layer, and a side surface of the first encapsulation layer away from the at least one of the light emitting elements 12 is a curved surface. The surface of the first encapsulation layer away from the light emitting element 12 is a curved surface, and a total reflection of the light at a light output surface can be destroyed relative to a planar encapsulation layer, thereby improving a light output ratio and avoiding a light energy loss.

It should be noted that only the above structure is described in the foregoing backlight module embodiment. It is to be understood that, in addition to the above structure, in the backlight module of the embodiment of the present invention, any other necessary structure may be included as needed, and is not limited herein.

In specific implementation, each of the above units or structures may be implemented as a separate entity, or may be combined in any combination, as one or several entities.

For the specific implementation of the above various units or structures, refer to the foregoing method embodiments, and details are not described herein again.

In the above, various other corresponding changes and modifications can be made according to the technical solutions and technical ideas of the present invention to those skilled in the art, and all such changes and modifications are within the scope of the claims of the present invention.

What is claimed is:

1. A backlight module, comprising:
a circuit board, wherein a side surface of the circuit board is provided with a plurality of light emitting elements spaced apart from each other, a light output surface of at least one of the light emitting elements is covered with a first encapsulation layer, and a side surface of the first encapsulation layer away from the at least one of the light emitting elements is a curved surface;
wherein an outer contour of a first cross section of the first encapsulation layer is on a first ellipse, the first cross section is perpendicular to a surface of the circuit board, a thickness of the first encapsulation layer is half a length of a long axis of the first ellipse, and the long axis of the first ellipse is perpendicular to the surface of the circuit board; and
a refractive index of the first encapsulation layer is less than 1.2.

2. The backlight module as claimed in claim 1, further comprising a second encapsulation layer, wherein the second encapsulation layer covers the side surface of the first encapsulation layer away from the light emitting elements, and a surface of the second encapsulation layer away from the side surface of the first encapsulation layer is a curved surface.

3. A backlight module, comprising a circuit board, wherein a side surface of the circuit board is provided with a plurality of light emitting elements spaced apart from each other, a light output surface of at least one of the light emitting elements is covered with a first encapsulation layer, and a side surface of the first encapsulation layer away from the at least one of the light emitting elements is a curved surface, wherein a refractive index of the first encapsulation layer is less than 1.2.

4. The backlight module as claimed in claim 3, wherein an outer contour of a first cross section of the first encapsulation layer is on a first ellipse, the first cross section is perpendicular to a surface of the circuit board, a thickness of the first encapsulation layer is half a length of a long axis of the first ellipse, and the long axis of the first ellipse is perpendicular to the surface of the circuit board.

5. The backlight module as claimed in claim 4, further comprising a second encapsulation layer, wherein the second encapsulation layer covers the side surface of the first encapsulation layer away from the light emitting elements, and a surface of the second encapsulation layer away from the side surface of the first encapsulation layer is a curved surface.

6. The backlight module as claimed in claim 5, wherein an outer contour of a second cross section of the second encapsulation layer comprises a first curve and a second curve, the second cross section is perpendicular to the surface of the circuit board, the first curve is disposed on a second ellipse, the second curve is disposed on a third ellipse, the second ellipse and the third ellipse do not coincide, a long axis of the second ellipse is perpendicular to the surface of the circuit board, and a long axis of the third ellipse is perpendicular to the surface of the circuit board.

7. The backlight module as claimed in claim 6, wherein the second ellipse and the third ellipse are symmetric about the long axis of the first ellipse, and a thickness of the outer contour of the second cross section is less than half a width of the outer contour of the second cross section.

8. The backlight module as claimed in claim 7, wherein an intersection of the first curve and the second curve is disposed on a side of an apex of the outer contour of the first cross section away from the circuit board, and a distance from the intersection of the first curve and the second curve to the apex of the outer contour of the first cross section is less than a half a length of the long axis of the first ellipse.

9. The backlight module as claimed in claim 5, wherein a refractive index of the second encapsulation layer is greater than 1.5.

10. The backlight module as claimed in claim 9, wherein a material of the first encapsulation layer is any one of silica gel or photoresist, a material of the second encapsulation layer is any one of silica gel or photoresist, and the light emitting element is an LED chip.

11. A display device, comprising:
a backlight module, wherein the backlight module comprises a circuit board, a side surface of the circuit board is provided with a plurality of light emitting elements spaced apart from each other, a light output surface of at least one of the light emitting elements is covered with a first encapsulation layer, and a side surface of the first encapsulation layer away from the at least one of the light emitting elements is a curved surface, wherein a refractive index of the first encapsulation layer is less than 1.2.

12. The display device as claimed in claim 11, wherein an outer contour of a first cross section of the first encapsulation layer is on a first ellipse, the first cross section is perpendicular to a surface of the circuit board, a thickness of the first encapsulation layer is half a length of a long axis of the first ellipse, and the long axis of the first ellipse is perpendicular to the surface of the circuit board.

13. The display device as claimed in claim 12, wherein the backlight module further comprises a second encapsulation layer, the second encapsulation layer covers the side surface of the first encapsulation layer away from the light emitting elements, and a surface of the second encapsulation layer away from the side surface of the first encapsulation layer is a curved surface.

14. The display device as claimed in claim 13, wherein an outer contour of a second cross section of the second encapsulation layer comprises a first curve and a second curve, the second cross section is perpendicular to the surface of the circuit board, the first curve is disposed on a second ellipse, the second curve is disposed on a third ellipse, the second ellipse and the third ellipse do not coincide, a long axis of the second ellipse is perpendicular to the surface of the circuit board, and a long axis of the third ellipse is perpendicular to the surface of the circuit board.

15. The display device as claimed in claim 14, wherein the second ellipse and the third ellipse are symmetric about the long axis of the first ellipse, and a thickness of the outer contour of the second cross section is less than half a width of the outer contour of the second cross section.

16. The display device as claimed in claim 15, wherein an intersection of the first curve and the second curve is disposed on a side of an apex of the outer contour of the first cross section away from the circuit board, and a distance from the intersection of the first curve and the second curve to the apex of the outer contour of the first cross section is less than a half a length of the long axis of the first ellipse.

17. The display device as claimed in claim 13, wherein a refractive index of the second encapsulation layer is greater than 1.5.

18. The display device as claimed in claim 17, wherein a material of the first encapsulation layer is any one of silica gel or photoresist, a material of the second encapsulation layer is any one of silica gel or photoresist, and the light emitting element is an LED chip.

* * * * *